US012787895B2

(12) United States Patent
Hayashida

(10) Patent No.: US 12,787,895 B2
(45) Date of Patent: Nov. 3, 2026

(54) METHOD FOR MANUFACTURING SEMICONDUCTOR DEVICE, SEMICONDUCTOR DEVICE, ELECTRIC POWER CONVERSION DEVICE, AND MOBILE BODY

(71) Applicant: Mitsubishi Electric Corporation, Tokyo (JP)

(72) Inventor: Yukimasa Hayashida, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 514 days.

(21) Appl. No.: 18/245,981

(22) PCT Filed: Mar. 5, 2021

(86) PCT No.: PCT/JP2021/008781
§ 371 (c)(1),
(2) Date: Mar. 20, 2023

(87) PCT Pub. No.: WO2022/185545
PCT Pub. Date: Sep. 9, 2022

(65) Prior Publication Data

US 2023/0352380 A1 Nov. 2, 2023

(51) Int. Cl.
*H10W 90/00* (2026.01)
*H10W 72/00* (2026.01)

(52) U.S. Cl.
CPC ....... *H10W 90/701* (2026.01); *H10W 72/071* (2026.01); *H10W 72/07236* (2026.01); *H10W 72/073* (2026.01); *H10W 90/736* (2026.01)

(58) Field of Classification Search
CPC ... H01L 23/49811; H01L 24/29; H01L 21/60; H01L 24/65; H10W 90/701; H10W 72/00
See application file for complete search history.

(56) References Cited

U.S. PATENT DOCUMENTS

2007/0210392 A1* 9/2007 Sakakibara ........... B81C 1/0023 257/414
2007/0278677 A1 12/2007 Ejima et al.
(Continued)

FOREIGN PATENT DOCUMENTS

CN 110447094 A 11/2019
CN 111243969 A 6/2020
(Continued)

OTHER PUBLICATIONS

International Search Report issued in PCT/JP2021/008781; mailed May 11, 2021.
(Continued)

*Primary Examiner* — Michele Fan
(74) *Attorney, Agent, or Firm* — Studebaker Brackett PLLC

(57) ABSTRACT

A semiconductor chip (6) is bonded to a metal pattern (5) of an insulating substrate (2). A recess (12) and a groove (13) are formed on an upper surface of an electrode (7). The groove (13) reaches a side surface of the electrode (7) from the recess (12). First solder (15) is placed in the recess (12). Second solder (17) is provided between an upper surface of the metal pattern (5) and a lower surface of the electrode (7). The first solder (15) and the second solder (17) are melted. The melted first solder (15) are fused to the second solder (17) via the groove (13) to form a solder fillet (14) which bonds the upper surface of the metal pattern (5) to the lower surface of the electrode (7) and covers the upper surface of the electrode (7).

7 Claims, 8 Drawing Sheets

(56) References Cited

U.S. PATENT DOCUMENTS

| | | | | |
|---|---|---|---|---|
| 2014/0217619 | A1* | 8/2014 | Zhao | H10W 72/015<br>257/784 |
| 2020/0043887 | A1 | 2/2020 | Ogawa et al. | |
| 2020/0168519 | A1 | 5/2020 | Nakahara et al. | |
| 2022/0020703 | A1* | 1/2022 | Nakamura | H01L 23/5386 |
| 2022/0157672 | A1 | 5/2022 | Takahashi | |

FOREIGN PATENT DOCUMENTS

| | | | |
|---|---|---|---|
| DE | 102021121875 | A1 | 5/2022 |
| JP | H06252310 | A * | 9/1994 |
| JP | H07-273258 | A | 10/1995 |
| JP | H09-283658 | A | 10/1997 |
| JP | 2010-010173 | A | 1/2010 |
| JP | 2013-098395 | A | 5/2013 |

OTHER PUBLICATIONS

Office Action issued in DE 11 2021 007 202.1 by the German Patent and Trade Mark Office on Nov. 15, 2025.

An Office Action issued by the China National Intellectual Property Administration on Aug. 28, 2026, corresponding to Chinese Patent Application No. 202180094999.9 and relating to U.S. Appl. No. 18/245,981, with English translation.

* cited by examiner

METHOD FOR MANUFACTURING SEMICONDUCTOR DEVICE, SEMICONDUCTOR DEVICE, ELECTRIC POWER CONVERSION DEVICE, AND MOBILE BODY

FIELD

The present disclosure relates to a method for manufacturing a semiconductor device, a semiconductor device, an electric power conversion device, and a mobile body.

BACKGROUND

A semiconductor device in which an electrode is solder-bonded to a metal pattern of an insulating substrate has been used. In a solder bonding process, solder is applied to an upper surface of the metal pattern or a lower surface of the electrode in advance (see, e.g., PTL 1). A solder fillet is formed by natural wetting and spreading of a melted solder.

CITATION LIST

Patent Literature

[PTL 1] JP H9-283658 A

SUMMARY

Technical Problem

A solder fillet formed using a conventional manufacturing method does not cover an upper surface of an electrode. Accordingly, strong bonding has not been able to be obtained, which has resulted in a short life of a solder bonding section. A worker has needed to always stick close to the solder fillet to visually confirm a formation state of the solder fillet, for example. In some cases, rework of formation of the solder fillet has occurred. This has made it difficult to reduce man-hours and shorten a construction period, which has resulted in poor workability. As a result, there has been a problem of low reliability and production efficiency of products.

The present disclosure has been made to solve the above-described problem, and has its object to obtain a method for manufacturing a semiconductor device capable of improving a reliability and a production efficiency, the semiconductor device, an electric power conversion device, and a mobile body.

Solution to Problem

A method for manufacturing a semiconductor device includes: bonding a semiconductor chip to a metal pattern of an insulating substrate; forming a recess and a groove on an upper surface of an electrode, the groove reaching a side surface of the electrode from the recess; placing first solder in the recess; providing second solder between an upper surface of the metal pattern and a lower surface of the electrode; and melting the first solder and the second solder, fusing the melted first solder to the second solder via the groove to form a solder fillet which bonds the upper surface of the metal pattern to the lower surface of the electrode and covers the upper surface of the electrode.

Advantageous Effects of Invention

In the present disclosure, the first plate solder is placed in the recess on the upper surface of the electrode, the first plate solder and the second solder are melted, and the melted first solder is fused to the second solder via the groove, to form the solder fillet. As a result, strong bonding can be obtained by wrapping the electrode with the solder fillet, thereby making it possible to extend the life of the bonding section. The first solder is placed in the recess. Accordingly, the first solder does not fall from the upper surface of the electrode during soldering, resulting in improved workability. The first solder can be quantified, thereby making it possible to stabilize solder bonding quality. This can result in improvements in reliability and production efficiency.

DESCRIPTION OF EMBODIMENTS

A method for manufacturing a semiconductor device, a semiconductor device, an electric power conversion device, and a mobile body according to the embodiments of the present disclosure will be described with reference to the drawings. The same components will be denoted by the same symbols, and the repeated description thereof may be omitted.

Embodiment 1

Figure 1:
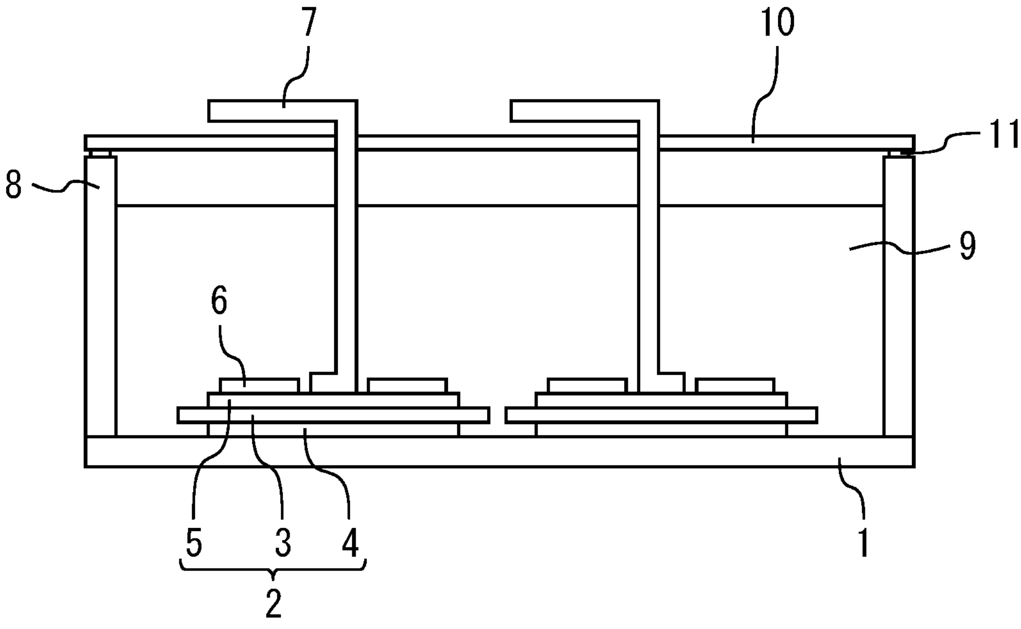
FIG. 1 is a cross-sectional view illustrating a semiconductor device according to an embodiment 1.

FIG. 1 is a cross-sectional view illustrating a semiconductor device according to an embodiment 1. An insulating substrate 2 is provided on a heat dissipation plate 1 such as a metal plate. The insulating substrate 2 has an insulating plate 3 such as a ceramic plate, a metal pattern 4 on a lower surface of the insulating plate 3, and a metal pattern 5 on an upper surface of the insulating plate 3. The metal pattern 4 is bonded to the heat dissipation plate 1 with solder or the like. A lower surface electrode of a semiconductor chip 6 is bonded to the metal pattern 5 with solder or the like. An upper surface electrode of the semiconductor chip 6 is wire-connected to another semiconductor chip or electrode. The semiconductor chip 6 may be an SiC-MOSFET or an SiC-SBD, although an IGBT or a diode made of Si.

A lower portion of an electrode 7 is bonded to the metal pattern 5. A case 8 is provided on an outer periphery of the heat dissipation plate 1, to surround the insulating substrate 2, the semiconductor chip 6, and the electrode 7. A sealing material 9 such as a silicone gel is provided in the case 8, to seal the insulating substrate 2, the semiconductor chip 6, and the lower portion of the electrode 7. A lid 10 is bonded to an upper surface of the case 8 with an adhesive 11 or the like, to cover the semiconductor chip 6 and the like from above. The electrode 7 protrudes upward from the sealing material 9 and the lid 10, and is pulled out of the device.

Figure 2:
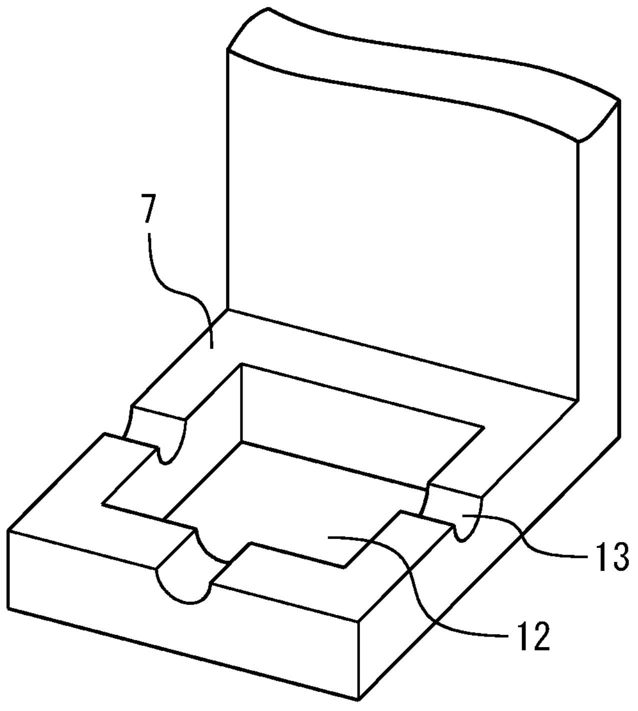
FIG. 2 is a perspective view illustrating the lower portion of the electrode according to the embodiment 1.

FIG. 2 is a perspective view illustrating the lower portion of the electrode according to the embodiment 1. The lower portion of the electrode 7 is laterally bent. An upper surface of the electrode 7 is provided with a recess 12. The upper surface of the electrode 7 is also provided with a groove 13 reaching a side surface of the electrode 7 from the recess 12. A planar shape of the recess 12 may be round, although square. The depth of the groove 13 is approximately one-third the thickness of the electrode 7. The depth of the recess 12 may be the same as that of the groove 13, although smaller than that of the groove 13.

Figure 3:
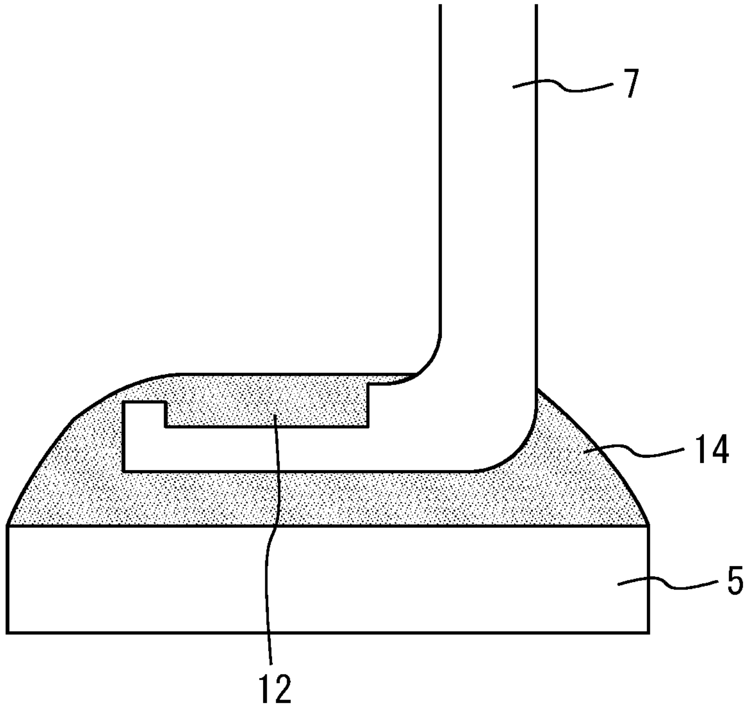
FIG. 3 is a cross-sectional view illustrating a bonding section between the electrode and the metal pattern according to the embodiment 1.

FIG. 3 is a cross-sectional view illustrating a bonding section between the electrode and the metal pattern according to the embodiment 1. A solder fillet 14 bonds the metal pattern 5 and a lower surface of the electrode 7 to each other. The solder fillet 14 entirely covers a bent portion of the electrode 7. That is, the solder fillet 14 covers not only the lower surface and the side surface of the electrode 7 but also the upper surface of the electrode 7. The solder fillet 14 is embedded in respective inner portions of the recess 12 and the groove 13.

Figure 4:
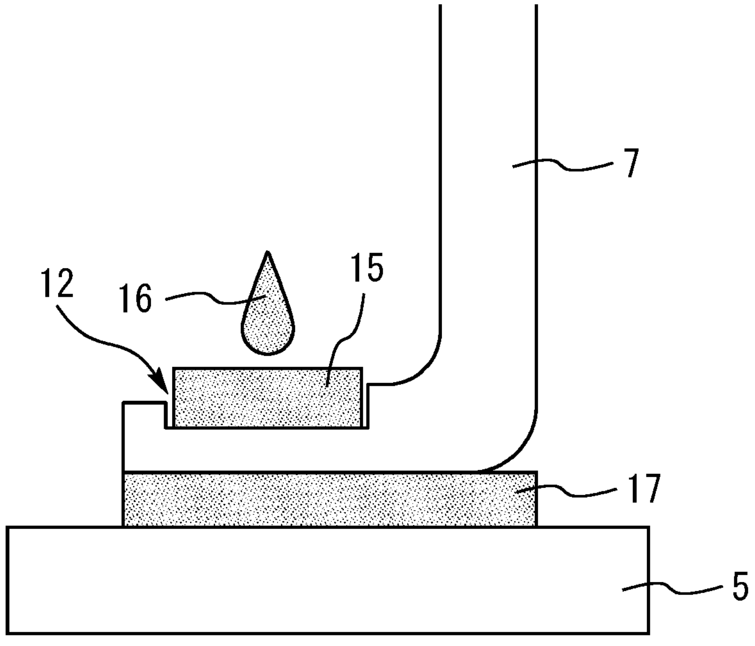
FIG. 4 is a cross-sectional view illustrating a process for bonding between the electrode and the metal pattern according to the embodiment 1.

Then, a method for manufacturing the semiconductor device according to the present embodiment will be described. FIG. 4 is a cross-sectional view illustrating a process for bonding between the electrode and the metal pattern according to the embodiment 1.

First, the semiconductor chip 6 is bonded to the metal pattern 5 of the insulating substrate 2. The recess 12 and the groove 13 are formed on the upper surface of the electrode 7 by pressing or the like. Then, a defined amount of first solder 15 such as cream solder or plate solder is placed in advance in the recess 12 on the upper surface of the electrode 7, as illustrated in FIG. 4. A flux 16 that promotes solder wettability may be dropped in the recess 12.

Second solder 17 such as cream solder is applied to an upper surface of the metal pattern 5 opposing the lower surface of the electrode 7. Alternatively, the second solder 17 may be applied to the lower surface of the electrode 7. The second solder 17 is provided between the upper surface of the metal pattern 5 and the lower surface of the electrode 7 using any method.

Then, the first solder 15 and the second solder 17 are melted. The melted first solder 15 flows out of the recess 12 through the groove 13. As a result, the melted first solder 15 is fused to the second solder 17 via the groove 13, to form the solder fillet 14. Then, sealing with the sealing material 9, for example, is performed, thereby manufacturing the semiconductor device.

Figure 5:
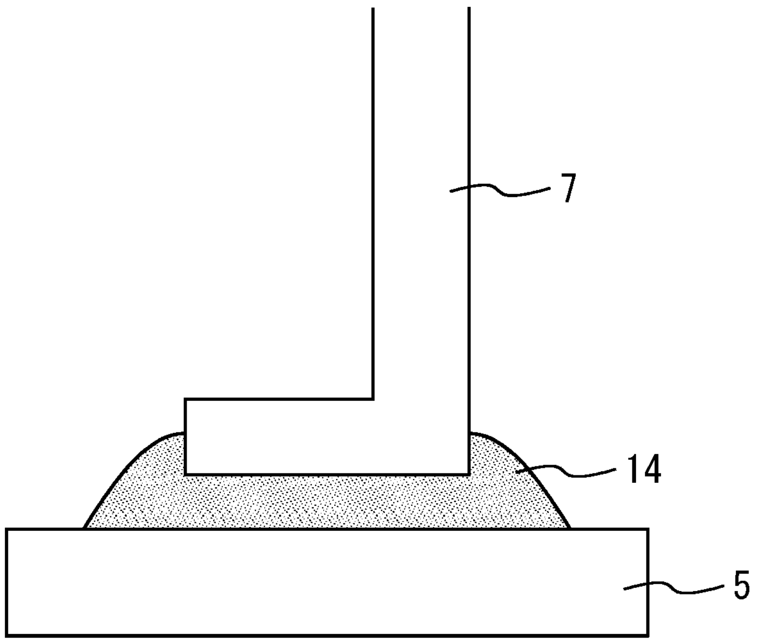
FIG. 5 is a cross-sectional view illustrating a process for bonding between an electrode and a metal pattern according to the comparative example.
Figure 6:
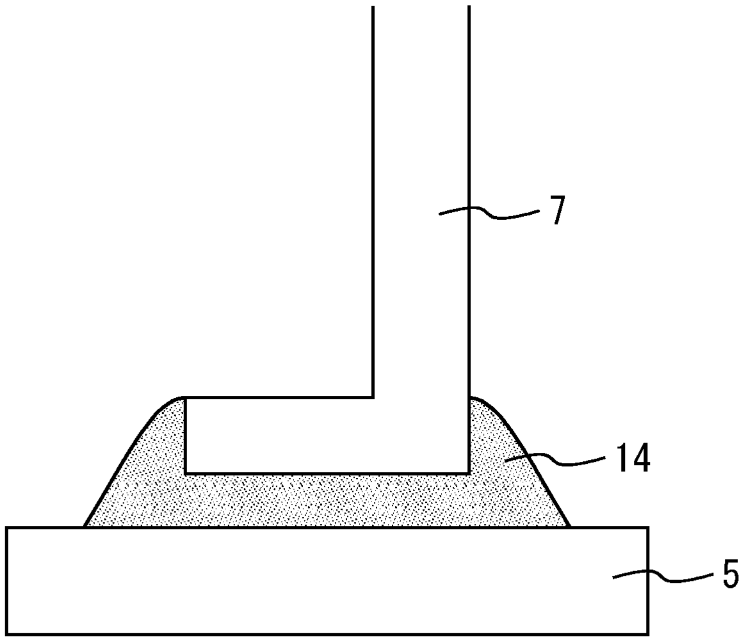
FIG. 6 is a cross-sectional view illustrating a process for bonding between an electrode and a metal pattern according to the comparative example.

Then, an effect of the present embodiment will be described by being compared with that of a comparative example. FIGS. 5 and 6 are cross-sectional views each illustrating a process for bonding between an electrode and a metal pattern according to the comparative example. In the comparative example, a first solder 15 is not placed on an upper surface of the electrode 7, but only a second solder 17 is used. Therefore, a solder fillet 14 is formed only by natural wetting and spreading of the melted second solder 17. Accordingly, the thickness of the solder fillet 14 cannot be increased. As a result, the solder fillet 14 is formed only to approximately one-half of the thickness of the electrode 7 in FIG. 5. The solder fillet 14 does not cover the upper surface of the electrode 7, although formed to the thickness of the electrode 7 in FIG. 6. Accordingly, strong bonding cannot be obtained, resulting in a short life of a bonding section. A worker needs to always stick close to the solder fillet 14 to visually confirm a formation state of the solder fillet 14, for example. In some cases, rework of formation of the solder fillet 14 occurs. This makes it difficult to reduce man-hours and shorten a construction period, resulting in poor workability.

On the other hand, in the present embodiment, a defined amount of the first solder 15 is placed in advance in the recess 12 on the upper surface of the electrode 7, the first solder 15 and the second solder 17 are melted, and the melted first solder 15 is fused to the second solder 17 via the groove 13, to form the solder fillet 14. As a result, strong bonding can be obtained by wrapping the electrode 7 with the solder fillet 14, thereby making it possible to extend the life of the bonding section. The first solder 15 is placed in the recess 12. Accordingly, the first solder 15 does not fall from the upper surface of the electrode 7 during soldering, resulting in improved workability. The first solder 15 can be quantified, thereby making it possible to stabilize solder bonding quality. This can result in improvements in reliability and production efficiency.

Embodiment 2

Figure 7:
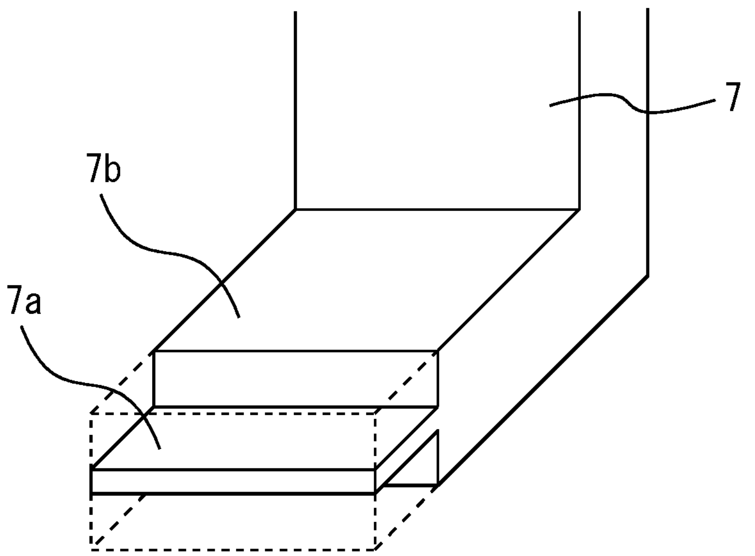
FIG. 7 is a perspective view illustrating a lower portion of an electrode according to an embodiment 2.
Figure 8:
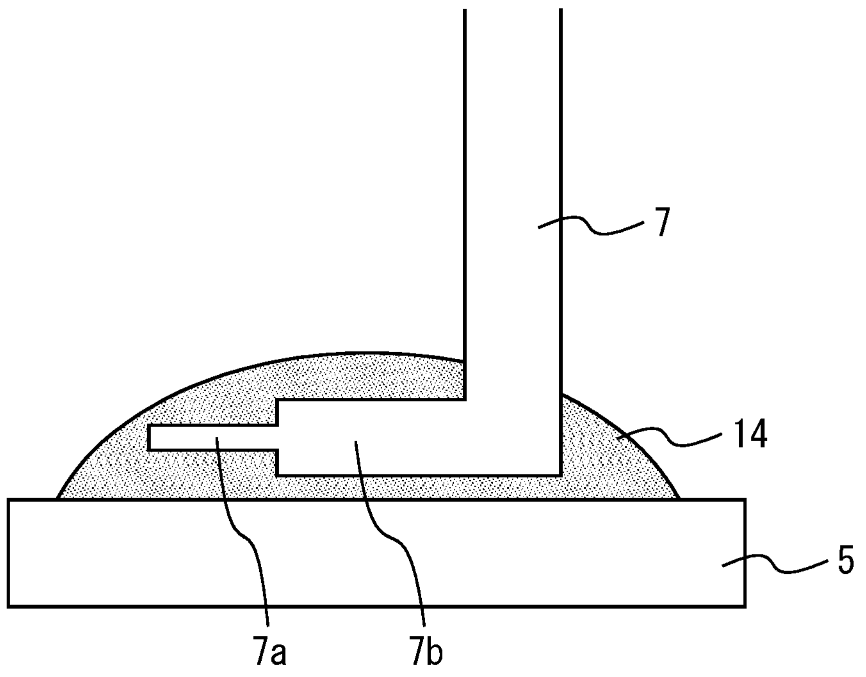
FIG. 8 is a cross-sectional view illustrating a bonding section between the electrode and a metal pattern according to the embodiment 2.

FIG. 7 is a perspective view illustrating a lower portion of an electrode according to an embodiment 2. An electrode 7 has a distal end section 7*a* and a main body section 7*b* thicker than the distal end section 7*a*. An upper surface of the distal end section 7*a* is lower than an upper surface of the main body section 7*b*. A lower surface of the distal end section 7*a* is higher than a lower surface of the main body section 7*b*. FIG. 8 is a cross-sectional view illustrating a bonding section between the electrode and a metal pattern according to the embodiment 2. A solder fillet 14 entirely covers a bent portion of the electrode 7. Other components in a semiconductor device are similar to those in the embodiment 1.

Figure 9:
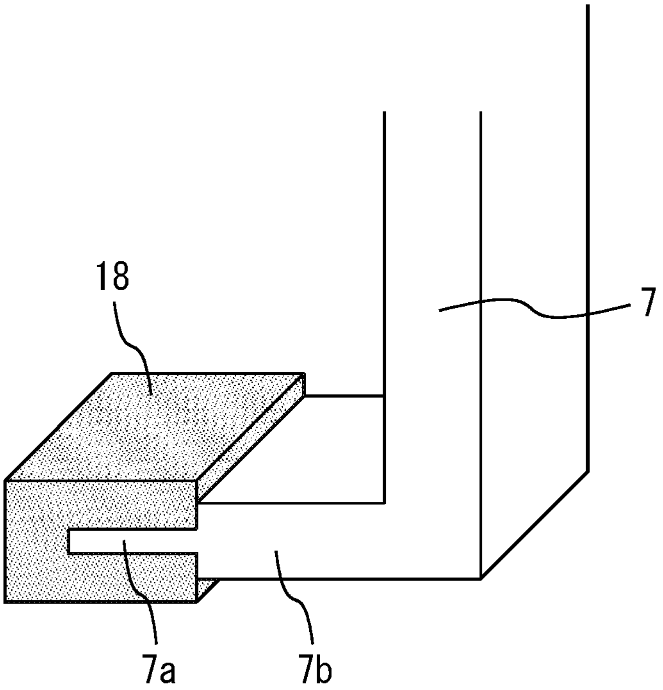
FIG. 9 is a perspective view illustrating the method for manufacturing the semiconductor device according to the embodiment 2.

Then, a method for manufacturing the semiconductor device according to the present embodiment will be described. Processes other than a process for bonding between the electrode 7 and the metal pattern 5 are similar to those in the embodiment 1, and hence description thereof is omitted. FIG. 9 is a perspective view illustrating the method for manufacturing the semiconductor device according to the embodiment 2.

First, the distal end section 7*a* of the electrode 7 is sandwiched by plate solder 18 having a U shape from above and below, as illustrated in FIG. 9. Then, a lower surface of the plate solder 18 is brought into contact with the heated metal pattern 5, to melt the plate solder 18, thereby forming the solder fillet 14 that covers an upper surface of the electrode 7 while bonding the metal pattern 5 and a lower surface of the electrode 7 to each other, as illustrated in FIG. 8. The solder fillet 14 also covers the upper surface of the main body section 7*b* in a thin film shape.

The plate solder 18 is thus brought into direct contact with the metal pattern 5 thus heated so that a solder melting time period is shortened, thereby making it possible to shorten a soldering work time period. The plate solder 18 having a U shape does not easily come off the electrode 7 by sandwiching the thin distal end section 7*a*, resulting in improved workability. Another configuration and effect are similar to those in the embodiment 1.

Figure 10:
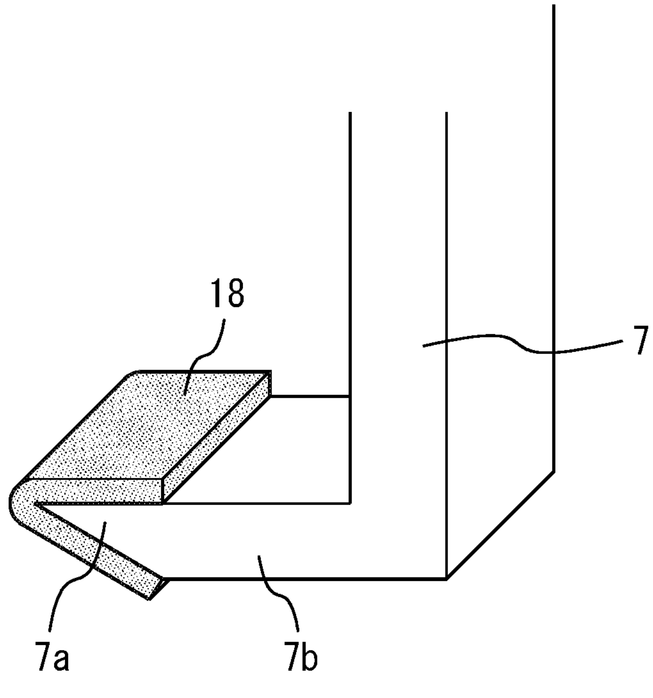
FIG. 10 is a perspective view illustrating a modification of the lower portion of the electrode according to the embodiment 2.

FIG. 10 is a perspective view illustrating a modification of the lower portion of the electrode according to the embodiment 2. Although the distal end section 7*a* of the electrode 7 is a thin plate in FIGS. 7 to 9, a distal end section 7*a* of an electrode 7 has an acute angle shape in FIG. 10. This makes it easy to sandwich the distal end section of the electrode 7 by plate solder 18 having a U shape.

Embodiment 3

Figure 11:
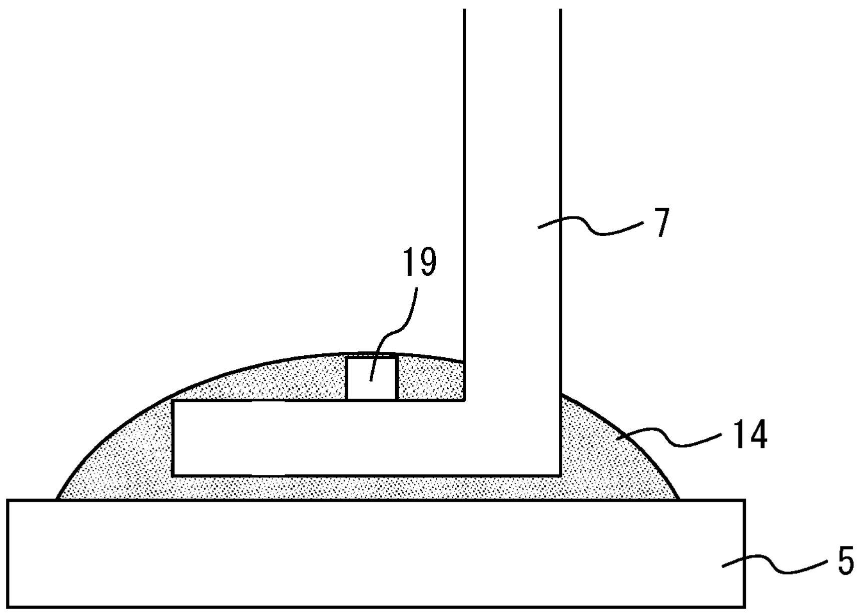
FIG. 11 is a cross-sectional view illustrating a bonding section between an electrode and a metal pattern according to an embodiment 3.

FIG. 11 is a cross-sectional view illustrating a bonding section between an electrode and a metal pattern according to an embodiment 3. A pillar-shaped protrusion 19 is provided in a central portion on an upper surface of an electrode 7. A solder fillet 14 entirely covers a bent portion of the electrode 7. Other components in a semiconductor device are similar to those in the embodiment 1.

Figure 12:
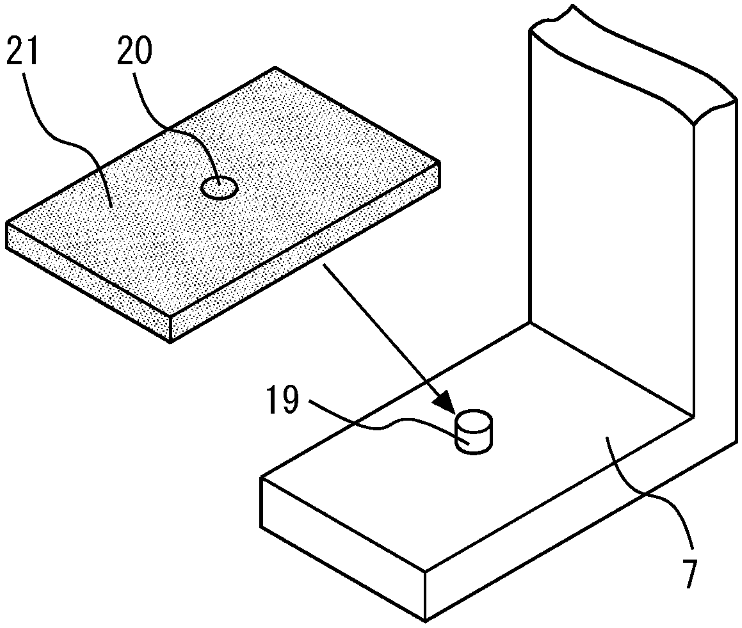
FIG. 12 is a perspective view illustrating the method for manufacturing the semiconductor device according to the embodiment 3.
Figure 13:
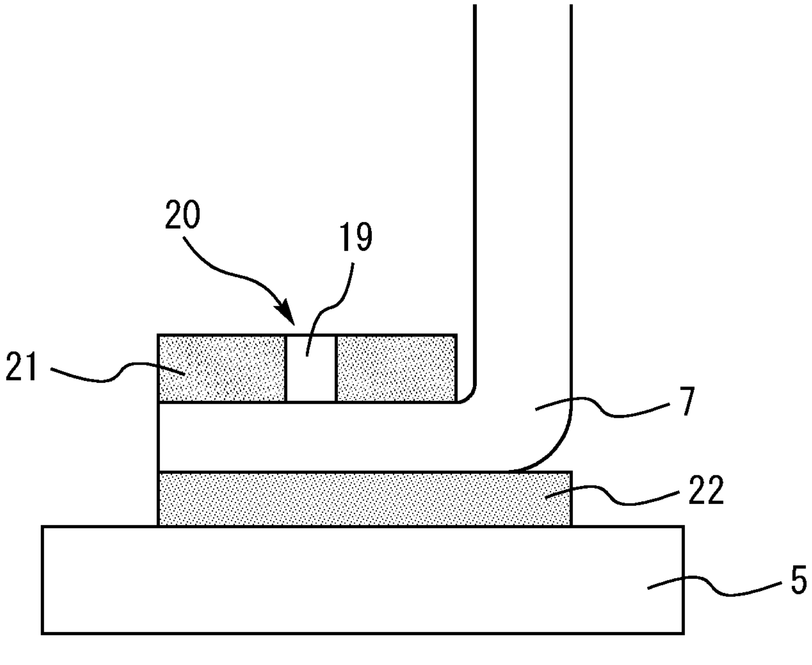
FIG. 13 is a cross-sectional view illustrating the method for manufacturing the semiconductor device according to the embodiment 3.

A method for manufacturing the semiconductor device according to the present embodiment will be described. Processes other than a process for bonding between the electrode 7 and a metal pattern 5 are similar to those in the embodiment 1, and hence description thereof is omitted. FIG. 12 is a perspective view illustrating the method for manufacturing the semiconductor device according to the embodiment 3. FIG. 13 is a cross-sectional view illustrating the method for manufacturing the semiconductor device according to the embodiment 3.

First, the electrode 7 having a pillar-shaped protrusion 19 provided in a central portion on its upper surface and plate solder 21 having an opening 20 having a round hole shape formed in its central portion are prepared, as illustrated in FIG. 12. Then, the plate solder 21 is placed on an upper surface of the electrode 7, and the protrusion 19 is inserted into the opening 20. As a result, the plate solder 21 is fixed on the upper surface of the electrode 7.

Solder 22 such as cream solder is applied to an upper surface of the metal pattern 5 opposing a lower surface of the electrode 7. Alternatively, the solder 22 may be applied to the lower surface of the electrode 7. The solder 22 is provided between the upper surface of the metal pattern 5 and the lower surface of the electrode 7 using any method.

Then, the plate solder 21 and the solder 22 are melted and fused to each other, to form the solder fillet 14 that covers the upper surface of the electrode 7 while bonding the upper surface of the metal pattern 5 and the lower surface of the electrode 7 to each other. Then, sealing with a sealing material 9, for example, is performed, thereby manufacturing the semiconductor device.

In the present embodiment, a defined amount of the plate solder 21 is placed in advance on the upper surface of the electrode 7, and the plate solder 21 and the solder 22 are melted and fused to each other, to form the solder fillet 14. As a result, strong bonding can be obtained by wrapping the electrode 7 with the solder fillet 14, thereby making it possible to extend the life of the bonding section. The protrusion 19 of the electrode 7 is inserted into the opening 20 of the plate solder 21. Accordingly, the plate solder 21 does not fall from the upper surface of the electrode 7 during soldering, resulting in improved workability. The plate solder 21 can be quantified, thereby making it possible to stabilize solder bonding quality. This can result in improvements in reliability and production efficiency. The plate solder 21 having a strip shape can be prepared in advance in a large amount, thereby making it possible to cope with mass productivity.

The semiconductor chip 6 is not limited to a chip formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated. Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved.

Embodiment 4

In this embodiment, the semiconductor devices according to the embodiments 1 to 3 described above are applied to an electric power conversion device. The electric power conversion device is, for example, an inverter device, a converter device, a servo amplifier, or a power supply unit. Although the present disclosure is not limited to a specific electric power conversion device, a case where the present disclosure is applied to a three-phase inverter will be described below.

Figure 14:
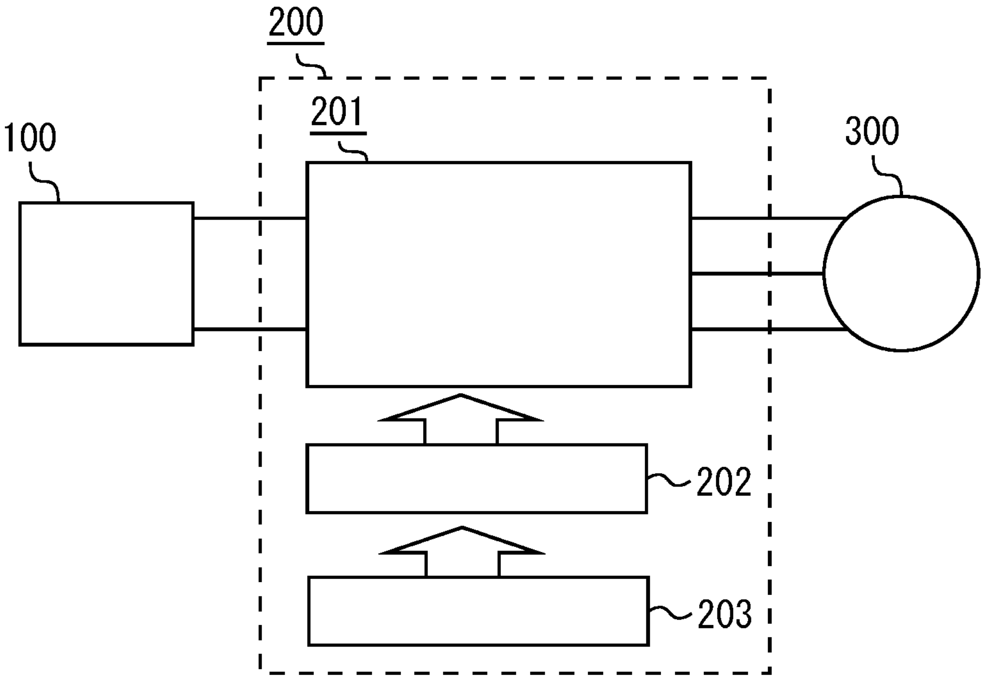
FIG. 14 is a block diagram illustrating a configuration of an electric power conversion system to which the electric power conversion device according to an embodiment 4 is applied.

FIG. 14 is a block diagram illustrating a configuration of an electric power conversion system to which the electric power conversion device according to an embodiment 4 is applied. This electric power conversion system includes a power supply 100, an electric power conversion device 200, and a load 300. The power supply 100 is a DC power supply and supplies DC power to the electric power conversion device 200. The power supply 100 can be composed of various components. For example, the power supply 100 can be composed of a DC system, a solar cell, or a storage battery, or may be composed of a rectifier or an AC/DC converter, which is connected to an AC system. Alternatively, the power supply 100 may be composed of a DC/DC converter that convers DC power output from a DC system to predetermined power.

The electric power conversion device 200 is a three-phase inverter connected to a node between the power supply 100 and the load 300, converts DC power supplied from the power supply 100 into AC power, and supplies the AC power to the load 300. The electric power conversion device 200 includes a main conversion circuit 201 that converts DC power into AC power and outputs the AC power, a drive circuit 202 outputting a drive signal for driving the switching device; and a control circuit 203 outputting a control signal for controlling the drive circuit 202 to the drive circuit 202.

The load 300 is a three-phase electric motor that is driven by AC power supplied from the electric power conversion device 200. The load 300 is not limited to a specific application. The load is used as an electric motor mounted on various electric devices, such as an electric motor for, for example, a hybrid vehicle, an electric vehicle, a railroad vehicle, an elevator, or an air-conditioner.

The electric power conversion device 200 will be described in detail below. The main conversion circuit 201 includes a switching device and a reflux diode (not illustrated). When the switching device is switched, the main conversion circuit 201 converts DC power supplied from the power supply 100 into AC power, and supplies the AC power to the load 300. The main conversion circuit 201 may have various types of specific circuit configurations. The main conversion circuit 201 according to this embodiment is a two-level three-phase full-bridge circuit, which can be composed of six switching devices and six reflux diodes connected in antiparallel with the respective switching devices. Each switching device and each reflux diode of the main conversion circuit 201 are composed of a semiconductor device corresponding to any one of the embodiments 1 to 3 described above. Every two switching devices of the six switching devices are connected in series and constitute a vertical arm. Each vertical arm constitutes each phase (U-phase, V-phase, W-phase) of the full-bridge circuit. Output terminals of each vertical arm, i.e., three output terminals of the main conversion circuit 201, are connected to the load 300.

The drive circuit 202 may be incorporated in the semiconductor device 202. Another drive circuit different from the semiconductor device 202 may be provided. The drive circuit generates a drive signal for driving each switching device of the main conversion circuit 201, and supplies the generated drive signal to a control electrode of each switching device of the main conversion circuit 201. Specifically, the drive circuit outputs, to the control electrode of each switching device, a drive signal for turning on each switching device and a drive signal for turning off each switching device, according to the control signal output from the control circuit 203, which is described later. When the ON-state of each switching device is maintained, the drive signal is a voltage signal (ON signal) having a voltage equal to or higher than a threshold voltage of the switching device. When the OFF-state of each switching device is maintained, the drive signal is a voltage signal (OFF signal) having a voltage equal to or lower than the threshold voltage of the switching device.

The control circuit 203 controls each switching device of the main conversion circuit 201 so as to supply a desired power to the load 300. Specifically, the control circuit 203 calculates a period (ON period), in which each switching device of the main conversion circuit 201 is in the ON state, based on the power to be supplied to the load 300. For example, the main conversion circuit 201 can be controlled by a PWM control for modulating the ON period of each switching device depending on the voltage to be output. Further, the control circuit 203 outputs a control command (control signal) to the drive circuit 202 so that the ON signal is output to each switching device to be turned on and an OFF signal is output to each switching device to be turned off at each point. The drive circuit outputs the ON signal or OFF signal, as the drive signal, to the control electrode of each switching device according to the control signal.

In the electric power conversion device according to this embodiment, the semiconductor devices according to any one of the embodiments 1 to 3 are applied as each switching device of the main conversion circuit 201. This can result in improvements in reliability and production efficiency.

While this embodiment illustrates an example in which the present disclosure is applied to a two-level three-phase inverter, the present disclosure is not limited to this and can be applied to various electric power conversion devices. While this embodiment illustrates a two-level electric power conversion device, the present disclosure can also be applied to a three-level or multi-level electric power conversion device. When power is supplied to a single-phase load, the present disclosure may be applied to a single-phase inverter. The present disclosure can also be applied to a DC/DC converter or an AC/DC converter when power is supplied to a DC load or the like.

Further, in the electric power conversion device to which the present disclosure is applied, the above-mentioned load is not limited to an electric motor. For example, the load may also be used as a power supply device for an electric discharge machine, a laser beam machine, an induction heating cooker, or a non-contact device power feeding system. More alternatively, the electric power conversion device may be used as a power conditioner for a photovoltaic power generating system, an electricity storage system, or the like.

Embodiment 5

Figure 15:
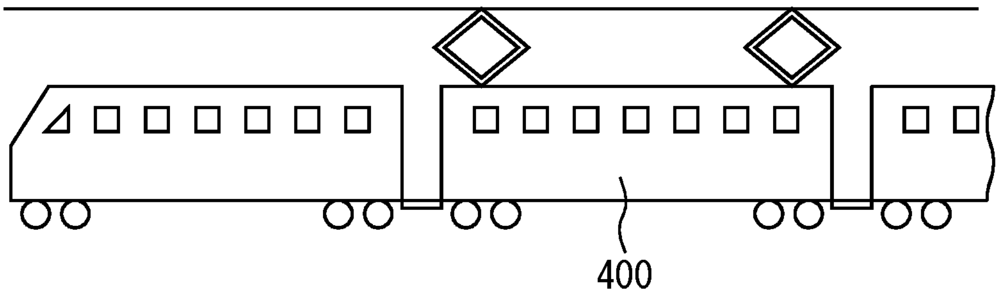
FIG. 15 is a diagram illustrating a mobile body according to an embodiment 5.

FIG. 15 is a diagram illustrating a mobile body according to an embodiment 5. The mobile body 400 is an electric train, for example, and performs electric power control using the electric power conversion device 200 according to the embodiment 4. This can result in improvements in reliability and production efficiency.

REFERENCE SIGNS LIST

2 insulating substrate; 5 metal pattern; 6 semiconductor chip; 7 electrode; 7*a* distal end section; 7*b* main body section; 12 recess; 13 groove; 14 solder fillet; 15 first solder; 17 second solder; 18 plate solder; 19 protrusion; 20 opening; 21 plate solder; 200 electric power conversion device; 201 main conversion circuit; 202 drive circuit; 203 control circuit; 400 mobile body

The invention claimed is:

1. A method for manufacturing a semiconductor device comprising:
   - bonding a semiconductor chip to a metal pattern of an insulating substrate;
   - forming a recess and a groove on an upper surface of an electrode, the groove reaching a side surface of the electrode from the recess;
   - placing first solder in the recess;
   - providing second solder between an upper surface of the metal pattern and a lower surface of the electrode; and
   - melting the first solder and the second solder, fusing the melted first solder to the second solder via the groove to form a solder fillet which bonds the upper surface of the metal pattern to the lower surface of the electrode and covers the upper surface of the electrode.

2. A semiconductor device comprising:

an insulating substrate having a metal pattern;

a semiconductor chip bonded to the metal pattern;

an electrode having a recess provided on an upper surface of the electrode and a groove reaching a side surface of the electrode from the recess, wherein the groove is shallower than the recess in a direction extending from the upper surface of the electrode to a lower surface of the electrode; and a solder fillet bonding an upper surface of the metal pattern to the lower surface of the electrode and covering the upper surface of the electrode.

3. The semiconductor device according to claim 2, wherein the semiconductor chip is formed of a wide-bandgap semiconductor.

4. An electric power conversion device comprising:

a main conversion circuit including the semiconductor device according to claim 2, converting input power and outputting converted power;

a drive circuit outputting a drive signal for driving the semiconductor device to the semiconductor device; and a control circuit outputting a control signal for controlling the drive circuit to the drive circuit.

5. A mobile body performing electric power control using the electric power conversion device according to claim 4.

6. The semiconductor device according to claim 2, wherein the groove is narrower than the recess in a direction perpendicular to the direction extending from the upper surface of the electrode to the lower surface of the electrode.

7. The semiconductor device according to claim 2, wherein the groove extends from a side surface of the recess to the side surface of the electrode, the side surface of the electrode being different from the side surface of the recess.

* * * * *